United States Patent
Weber et al.

(10) Patent No.: US 10,525,673 B2
(45) Date of Patent: Jan. 7, 2020

(54) COMPOSITE PANE WITH A CAPACITIVE SWITCHING ZONE

(71) Applicant: SAINT-GOBAIN GLASS FRANCE, Courbevoie (FR)

(72) Inventors: Patrick Weber, Alsdorf (DE); Stefan Droste, Herzogenrath (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 14 days.

(21) Appl. No.: 15/545,077

(22) PCT Filed: Jan. 15, 2016

(86) PCT No.: PCT/EP2016/050789
§ 371 (c)(1),
(2) Date: Jul. 20, 2017

(87) PCT Pub. No.: WO2016/116372
PCT Pub. Date: Jul. 28, 2016

(65) Prior Publication Data
US 2018/0009198 A1    Jan. 11, 2018

(30) Foreign Application Priority Data
Jan. 20, 2015 (EP) ..................................... 15151763

(51) Int. Cl.
*B32B 17/10* (2006.01)
*H03K 17/96* (2006.01)
*H03K 17/975* (2006.01)

(52) U.S. Cl.
CPC .. *B32B 17/10192* (2013.01); *B32B 17/10036* (2013.01); *B32B 17/10761* (2013.01);
(Continued)

(58) Field of Classification Search
None
See application file for complete search history.

(56) References Cited

U.S. PATENT DOCUMENTS 6,452,514 B1    9/2002    Philipp
6,654,070 B1    11/2003   Rofe
(Continued)

FOREIGN PATENT DOCUMENTS

DE    20 2006 006 192 U1    7/2006
DE    20 2008 017 611 U1    4/2010
(Continued)

OTHER PUBLICATIONS

International Search Report as issued in International Patent Application No. PCT/EP2016/050789, dated Mar. 16, 2016.

*Primary Examiner* — Katie L. Hammer
(74) *Attorney, Agent, or Firm* — Pillsbury Winthrop Shaw Pittman LLP

(57) ABSTRACT

A composite pane with a capacitive switching zone includes a substrate, a first intermediate layer areally bonded to the substrate, a second intermediate layer areally bonded to the first intermediate layer, and a cover pane areally bonded to the second intermediate layer. A carrier film with an electrically conductive layer is arranged between the first and second intermediate layers. A capacitive switching zone is electrically isolated from the electrically conductive layer by a coating-free separating line, the capacitive switching zone has a contact zone, a supply line zone, and a connection zone; the supply line zone electrically connects the contact zone to the connection zone, and the connection zone is electrically connectable to sensor electronics. The surface capacitance between the contact zone and the outside surface of the substrate is greater than the surface capacitance between the contact zone and the outside surface of the cover pane.

26 Claims, 7 Drawing Sheets

Figure 1A:
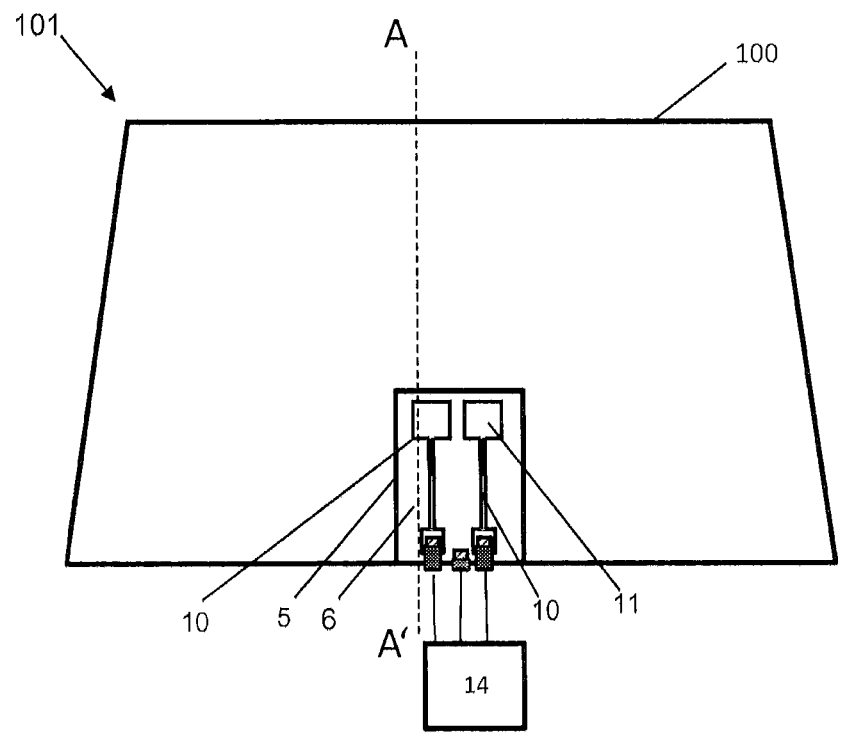

(52) U.S. Cl.
CPC ........ *H03K 17/962* (2013.01); *B32B 2605/08* (2013.01); *H03K 2017/9602* (2013.01); *H03K 2217/94094* (2013.01); *H03K 2217/960755* (2013.01)

(56) References Cited

U.S. PATENT DOCUMENTS

2006/0275599 A1    12/2006  Lefevre
2010/0179725 A1     7/2010  Boote et al.

FOREIGN PATENT DOCUMENTS

| EP | 0 146 198 A | 6/1985 |
| EP | 0 847 965 B1 | 6/1998 |
| EP | 0 899 882 A1 | 3/1999 |
| EP | 1 515 211 A1 | 3/2005 |
| EP | 2 139 049 A1 | 12/2009 |
| EP | 2 200 097 A1 | 6/2010 |
| GB | 2 090 979 A | 7/1982 |
| GB | 2 423 808 A | 9/2006 |
| WO | WO 2012/052315 A1 | 4/2012 |
| WO | WO 2015/086599 A1 | 6/2015 |

COMPOSITE PANE WITH A CAPACITIVE SWITCHING ZONE

CROSS-REFERENCE TO RELATED APPLICATIONS

This application is the U.S. National Stage of PCT/EP2016/050789, filed Jan. 15, 2016, which in turn claims priority to European patent application number 15151763.8 filed Jan. 20, 2015. The content of these applications are incorporated herein by reference in their entireties.

The invention relates to a composite pane with a capacitive switching zone, a pane arrangement, a method for producing the composite pane, and its use.

It is known that switching zones can be formed by a surface electrode or by an arrangement of two coupled electrodes, for example, as capacitive switching zones. When an object approaches the switching zone, the capacitance of the surface electrode against ground or the capacitance of the capacitor formed by the two coupled electrodes changes. Such switching zones are known, for example, from US 2010/179725 A1, U.S. Pat. No. 6,654,070 B1, and US 2006/275599 A1.

The capacitance change is measured by a circuit arrangement or sensor electronics and when a threshold value is exceeded, a switching signal is triggered. Circuit arrangements for capacitive switches are known, for example, from DE 20 2006 006 192 U1, EP 0 899 882 A1, U.S. Pat. No. 6,452,514 B1, and EP 1 515 211 A1.

The object of the present invention consists in providing an improved composite pane, which has a capacitive switching zone, which can be simply and economically integrated into the composite pane and which impairs vision through the pane only little or not at all. With the capacitive switching zone, a contact sensor can be formed in a simple manner.

The object of the present invention is accomplished according to the invention by a composite pane with a switching zone in accordance with the independent claim 1. Preferred embodiments emerge from the subclaims.

The composite pane according to the invention with a capacitive switching zone comprises at least the following characteristics:
one substrate,
  at least one first intermediate layer, which is areally bonded to the substrate,
  at least one second intermediate layer, which is areally bonded to the first intermediate layer, and
  one cover pane, which is areally bonded to the second intermediate layer,
wherein
  a carrier film with an electrically conductive layer is arranged, at least in sections, between the first intermediate layer and the second intermediate layer,
  a capacitive switching zone is electrically isolated from the electrically conductive layer by at least one coating-free separating line,
  the capacitive switching zone has a contact zone, a supply line zone, and a connection zone; the supply line zone electrically connects the contact zone to the connection zone, and the connection zone is electrically connectable to sensor electronics, and
  the surface capacitance $c_I$ between the contact zone and the outside surface of the substrate is greater than the surface capacitance $c_A$ between the contact zone and the outside surface of the cover pane.

The surface capacitance $c_I$ or $c_A$ is defined as the capacitance of a plate capacitor of that zone of the composite pane resulting from orthogonal projection of the contact zone between the contact zone and the outside surface of the substrate or the outside surface of the cover pane, with the resultant capacitance normalized over the area of the contact zone. Here, the term "outside surface" means the surface of the composite pane that points toward the outside, i.e., away from the composite pane. Accordingly, "inside surface" means the surface of the substrate or of the cover pane that points into the interior of the composite pane and is areally connected to an intermediate layer.

The surface capacitance is thus the capacitance of the entire layer sequence (coating) normalized over the area (and in particular over the aforementioned orthogonal projection area) between the electrically conductive layer and the respective outside surface of the composite pane.

In an advantageous embodiment of the invention, the ratio of length $l_Z$ to width $b_Z$ of the supply line zone is less than or equal to 1:700 and preferably from 1:1 to 1:100. In the context of the present invention, when the supply line zone does not have a constant width $b_Z$, for example, when it is implemented in the shape of a trapezoid or of a drop, the term "width $b_Z$" means the averaged width of the supply line zone.

The length $l_Z$ of the supply line zone is preferably from 1 cm to 70 cm and particularly preferably from 3 cm to 8 cm. The width $b_Z$ of the supply line zone is preferably from 0.5 mm to 10 mm and particularly preferably from 0.5 mm to 2 mm. The supply line zone preferably has the shape of a rectangle, a strip, or a line.

In an advantageous embodiment of the composite pane according to the invention, the connection zone is arranged on the outer edge of the pane. The distance from the outer edge is preferably less than 10 cm, particularly preferably less than 0.5 cm. This makes it possible to conceal an electrical contacting of the connection zone, for example, to a foil conductor, under an optically inconspicuous black imprint or with a covering, for example, a camera housing.

In an advantageous embodiment of the switching zone according to the invention, the contact zone has an area from 1 cm$^2$ to 200 cm$^2$, particularly preferably from 1 cm$^2$ to 9 cm$^2$. The length $l_B$ of the contact zone is preferably from 1 cm to 14 cm and particularly preferably from 1 cm to 3 cm. The maximum width $b_B$ of the contact zone is preferably from 1 cm to 14 cm and particularly preferably from 1 cm to 3 cm. The contact zone can, in principle, have any shape. Particularly suitable contact zones are implemented circular, elliptical, or drop-shaped. Alternatively, angular shapes are possible, for example, triangles, squares, rectangles, trapezoids, or other types of quadrangles or polygons of a higher order. Generally speaking, it is particularly advantageous for any corners to be rounded. This is true for all regions of the switching zone, in particular in the transition zone between the contact zone and the supply line zone and/or the supply line zone and the connection zone. It is particularly advantageous for the corners to have a radius of curvature of at least 3 mm, preferably of at least 8 mm.

In another advantageous embodiment of the switching zone according to the invention, the ratio of the width $b_Z$ of the supply line zone to the maximum width $b_B$ of the contact zone is at least 1:2 and in particular at least 1:10. Thus, it was possible to obtain particularly good switching results.

In an advantageous embodiment of the pane according to the invention, the width $t_1$ of the separating lines is from 30 μm to 200 μm and preferably from 70 μm to 140 μm. Such thin separating lines enable reliable and adequately high electrical isolation and, at the same time, interfere with vision through the composite pane only slightly or not at all.

The switching zone is a capacitive switching zone, in other words, it is specially implemented for capacitive contact detection. In an advantageous embodiment, the switching zone forms a surface electrode. The capacitance of the surface electrode is measured via external capacitance sensor electronics. The capacitance of the surface electrode changes against ground if an object (for example, a human body) comes into its proximity or, for example, touches an insulator layer above the surface electrode. The insulator layer comprises, in particular, the substrate itself. The capacitance change is measured by the sensor electronics; and when a threshold value is exceeded, a switching signal is triggered. The switching zone is defined by the shape and size of the surface electrode.

The region of the electrically conductive layer that is arranged outside the capacitive switching zone—referred to in the following as "surrounding zone"—can be connectable to the sensor electronics via another connection zone.

In such an arrangement, the capacitive switching zone and the surrounding zone form two electrodes that are capacitively coupled to each other. The capacitance of the capacitor formed by the electrodes is altered by the approach of an object, for example, a human body part. The capacitance change is measured by sensor electronics and when a threshold value is exceeded, a switching signal is triggered. The sensitive zone is defined by the shape and size of the zone into which the electrodes are capacitively coupled.

The capacitive switching zone according to the invention and, optionally, the surrounding zone are integrated into the composite pane according to the invention. Thus, no switch or the like is necessary as a separate component that must be mounted on the composite pane. The composite pane preferably also has no other components that are arranged in the transparent zone on its surfaces. This is particularly advantageous with regard to thin construction of the composite pane as well as only slight interference with vision through the composite pane.

An advantageous aspect of the invention comprises a pane arrangement with a composite pane according to the invention and sensor electronics, which are electrically connected to the capacitive switching zone via the connection zone and, optionally, to the surrounding surface via another connection zone. The sensor electronics are capacitive sensor electronics.

In an advantageous embodiment of the circuit arrangement according to the invention, the sensitivity of the sensor electronics is selected such that the sensor electronics issue a switching signal when the contact zone on the substrate is touched by a human finger and issue no switching signal or a different switching signal when the contact zone on the cover pane is touched. Of course, the touching of the contact zone can also be done with multiple fingers or a different part of the human body. In the context of this invention, "touching" means any interaction with the switching zone that results in a measurable change in the measurement signal, i.e., in this case, the capacitance. In particular, this is touching of an outside surface of the composite pane in a zone generated by orthogonal projection of the contact zone onto the outside surface.

In an advantageous embodiment of the composite pane according to the invention, the ratio of the surface capacitance $c_I$ to the surface capacitance $c_A$ is greater than or equal to 1.1:1, preferably greater than or equal to 1.2:1. For such ratios, touching of the outside surface of the substrate can already be readily distinguished from touching the outside surface of the cover pane.

The switching signals issued can be of any type and adapted to the requirements of the respective use. Thus, the switching signal can mean a positive voltage, for example, 12 V, no switching signal can mean, for example, 0 V, and another switching signal can mean, for example, +6 V. The switching signals can also correspond to the voltages CAN_High and CAN_Low customary with a CAN-Bus and change by a voltage value between them. The switching signal can also be pulsed and/or digitally coded.

The sensitivity of the sensor electronics can be determined as a function of the size of the contact zone and as a function of the thickness of the substrate, intermediate layers, and cover pane in the context of simple experiments.

The particular advantage of such a pane arrangement according to the invention resides in that the switching signal can be triggered only by touching the composite pane from one of the outside surfaces. In the case of a use of the pane arrangement in a motor vehicle window and installation of the composite pane with the substrate side in the direction of the vehicle interior, it is possible, for example, to reliably prevent triggering the switching operation by individuals from the outside or an unintended triggering of the switching operation by rain or the movement of the windshield wiper, without fundamentally altering the pane construction customary for laminated safety glass. This was unexpected and surprising for the person skilled in the art.

In combination with the just described pane arrangement or alternatively thereto, the sensitivity of the sensor electronics can be selected such that a switching signal is issued when the contact zone on the substrate and/or the cover pane is touched by a human finger and no switching signal or a different switching signal is issued when the supply line zone on the substrate and/or the cover pane is touched.

The sensitivity of the sensor electronics can be determined as a function of the size of the contact zone and as a function of the geometry as well as the aspect ratio between width and length of the supply line zone in the context of simple experiments. It is particularly advantageous for the width of the supply line zone to be selected as small as possible.

The particular advantage of this embodiment of a pane arrangement according to the invention resides in the fact that the switching signal can be triggered only by touching the outside surface of the composite pane via the contact zone or its immediate surroundings and, thus, precise control of the switching operation is possible, and, for example, inadvertent switching is prevented.

In an advantageous improvement of a pane arrangement according to the invention, the connection zone is connected to a flat conductor and the flat conductor is guided out of the pane. The integrated pane arrangement can then be particularly simply connected, at the place of use, to a voltage source and to a signal line that evaluates the switching signal of the sensor circuit, for example, via a CAN-Bus in a vehicle.

In principle, all electrically insulating substrates that are thermally and chemically stable as well as dimensionally stable under the conditions of production and use of the composite pane according to the invention are suitable as substrate and cover pane.

The substrate and/or the cover pane preferably contain glass, particularly preferably flat glass, float glass, quartz glass, borosilicate glass, soda lime glass, or clear plastics, preferably rigid clear plastics, in particular polyethylene, polypropylene, polycarbonate, polymethyl methacrylate, polystyrene, polyamide, polyesters, polyvinyl chloride, and/or mixtures thereof. The substrate and/or the cover pane are preferably transparent, in particular for the use of the pane as a windshield or rear window of a vehicle or other uses where high light transmittance is desired. In the context of the invention, "transparent" means a pane that has transmittance greater than 70% in the visible spectral range. However, for panes that are not situated in the traffic-relevant field of view of the driver, for example, for roof panels, the transmittance can also be much lower, for example, greater than 5%.

The thickness of the substrate and/or cover pane can vary widely and thus be ideally adapted to the requirements of the individual case. Preferably, standard thicknesses from 1.0 mm to 25 mm, preferably from 1.4 mm to 2.5 mm are used for motor vehicle glass and, preferably, from 4 mm to 25 mm for furniture, devices, and buildings, in particular for electric heaters. The size of the pane can vary widely and is governed by the size of the use according to the invention. The substrate and, optionally, the cover pane have, for example, in motor vehicle engineering and the architectural sector customary areas of 200 cm$^2$ up to 20 m$^2$.

The composite pane can have any three-dimensional shape. Preferably, the three-dimensional shape has no shadow zones such that it can, for example, be coated by cathodic sputtering. Preferably, the substrates are planar or slightly or greatly curved in one or a plurality of spatial directions. In particular, planar substrates are used. The panes can be colorless or colored.

The substrate and/or the cover pane preferably have relative permittivity $\varepsilon_{r,1/4}$ from 2 to 8 and particularly preferably from 6 to 8. With such relative permittivities, it was possible to obtain a particularly good differentiation between touching the contact surface via the outside surface of the substrate compared to the outside surface of the cover pane.

Substrates and/or cover panes are bonded to each other by at least one first and one second intermediate layer. The intermediate layer is preferably transparent. The intermediate layer preferably contains at least one plastic, preferably polyvinyl butyral (PVB), ethylene vinyl acetate (EVA), and/or polyethylene terephthalate (PET). The intermediate layer can, however, also contain, for example, polyurethane (PU), polypropylene (PP), polyacrylate, polyethylene (PE), polycarbonate (PC), polymethyl methacrylate, polyvinyl chloride, poly acetate resin, casting resins, acrylates, fluorinated ethylene propylenes, polyvinyl fluoride, and/or ethylene tetrafluoroethylene, or copolymers or mixtures thereof. The intermediate layer can be formed by one or even a plurality of films arranged one over another, with the thickness of a film preferably being from 0.025 mm to 1 mm, typically 0.38 mm or 0.76 mm. The intermediate layers can preferably be thermoplastic, and, after the lamination, adhesively bond the substrate, the cover pane, and any other intermediate layers to each other. In a particularly advantageous embodiment of the composite pane according to the invention, the first intermediate layer is implemented as an adhesive layer made of an adhesive, with which the carrier film is adhesively bonded onto the substrate. In this case, the first intermediate layer preferably has the dimensions of the carrier film.

The intermediate layer preferably has relative permittivity from 2 to 4 and particularly preferably from 2.1 to 2.9. With such relative permittivities, it was possible to obtain a particularly good differentiation between touching the contact surface via the outside surface of the substrate compared to the outside surface of the cover pane.

The carrier film according to the invention is preferably transparent. It preferably contains or is made of a polyethylene terephthalate (PET) film. The thickness of the carrier film is preferably from 0.025 mm to 0.1 mm. The carrier film preferably has a relative permittivity from 2 to 4 and particularly preferably from 2.7 to 3.3. Particularly good composite panes can be produced with such carrier films because such thin carrier films can be readily and optically inconspicuously integrated into the composite pane even with only section-wise arrangement. At the same time, good and selective switching signals can be generated. The electrically conductive layer according to the invention is preferably arranged on a surface of the carrier film, in other words, on precisely one of the two sides of the carrier film (i.e., on its front side or its back side).

The terms "substrate" and "cover pane" are selected to differentiate the two panes of a composite pane according to the invention. No statement about the geometric arrangement is associated with the terms. When the composite pane according to the invention is provided, for example, in an opening, for example, of a vehicle or a building, to separate the interior from the external environment, the substrate can be turned toward the interior or the external environment.

The electrically conductive layer preferably contains a transparent, electrically conductive coating. Here, "transparent" means permeable to electromagnetic radiation, preferably electromagnetic radiation of a wavelength from 300 nm to 1,300 nm and in particular to visible light.

Electrically conductive layers according to the invention are known, for example, from DE 20 2008 017 611 U1, EP 0 847 965 B1, or WO2012/052315 A1. They typically contain one or a plurality, for example, two, three, or four electrically conductive, functional layers. The functional layers preferably contain at least one metal, for example, silver, gold, copper, nickel, and/or chromium, or a metal alloy. The functional layers particularly preferably contain at least 90 wt.-% of the metal, in particular at least 99.9 wt.-% of the metal. The functional layers can be made of the metal or of the metal alloy. The functional layers particularly preferably contain silver or a silver-containing alloy. Such functional layers have a particularly advantageous electrical conductivity with, at the same time, high transmittance in the visible spectral range. The thickness of a functional layer is preferably from 5 nm to 50 nm, particularly preferably from 8 nm to 25 nm. In this range for the thickness of the functional layer, advantageously high transmittance in the visible spectral range and particularly advantageous electrical conductivity are obtained.

Typically, at least one dielectric layer is arranged, in each case, between two adjacent functional layers. Preferably, another dielectric layer is arranged below the first and/or above the last functional layer. A dielectric layer includes at least one individual layer made of a dielectric material, for example, containing a nitride such as silicon nitride or an oxide such as aluminum oxide. However, the dielectric layer can also include a plurality of individual layers, for example, individual layers of a dielectric material, smoothing layers, adaptation layers, blocker layers, and/or anti-reflexion layers. The thickness of a dielectric layer is, for example, from 10 nm to 200 nm.

This layer structure is, in general, obtained by a sequence of deposition operations that are performed by a vacuum method such as magnetically enhanced cathodic sputtering.

Other suitable electrically conductive layers preferably contain indium tin oxide (ITO), fluorine-doped fin oxide ($SnO_2$:F), or aluminum-doped zinc oxide (ZnO:Al).

The electrically conductive layer can, in principle, be any coating that can be electrically contacted. If the pane according to the invention is intended to enable vision through it, as is, for example, the case in panes in the window sector, the electrically conductive layer is preferably transparent. In an advantageous embodiment, the electrically conductive layer is a layer or a layer structure of multiple individual layers with a total thickness less than or equal to 2 μm, particularly preferably less than or equal to 1 μm.

An advantageous transparent electrically conductive layer according to the invention has sheet resistance of 0.4 ohm/square to 200 ohm/square. In a particularly preferred embodiment, the electrically conductive layer according to the invention has sheet resistance of 0.5 ohm/square to 20 ohm/square. Coatings with such sheet resistances are particularly suited for heating motor vehicle panes with typical onboard voltages from 12 V to 48 V or with electric vehicles with typical onboard voltages of up to 500 V.

The electrically conductive layer can extend over the entire surface of one side of the carrier film. However, alternatively, the electrically conductive layer can also extend over only a part of the surface of the carrier film. The electrically conductive layer can have one or a plurality of uncoated zones. These zones can be permeable to electromagnetic radiation and are, for example, known as data transmission windows or communication windows.

In an advantageous embodiment of a composite pane according to the invention, the electrically conductive layer is arranged set back from the edge of the composite pane by a width of 2 mm to 50 mm, preferably of 5 mm to 20 mm. The electrically conductive layer then has no contact with the atmosphere and is advantageously protected, by the intermediate layers in the interior of the composite pane, against damage and corrosion.

The electrical supply line is preferably implemented as a foil conductor or a flexible foil conductor (flat conductor, flat band conductor). The term "foil conductor" means an electrical conductor whose width is clearly greater than its thickness. Such a foil conductor is, for example, a strip or band containing or made of copper, tinned copper, aluminum, silver, gold, or alloys thereof. The foil conductor has, for example, a width of 2 mm to 16 mm and a thickness of 0.03 mm to 0.1 mm. The foil conductor can have an insulating, preferably polymeric sheathing, for example, based on polyimide. Foil conductors that are suitable for the contacting of electrically conductive coatings in panes have a total thickness of, for example, merely 0.3 mm. Such thin foil conductors can be embedded without difficulty between the individual panes in the thermoplastic intermediate layer. Multiple conductive layers electrically isolated from each other can be situated in a foil conductor strip.

Alternatively, thin metal wires can also be used as an electrical supply line. The metal wires contain in particular copper, tungsten, gold, silver, or aluminum or alloys of at least two of these metals. The alloys can also contain molybdenum, rhenium, osmium, iridium, palladium, or platinum.

The electrical line connection between the connection zones of the electrically conductive layer on the carrier film and the electrical supply line is preferably done via electrically conductive adhesives, which enable a reliable and durable electrical line connection between the connection zone and the supply line. Alternatively, the electrical line connection can also be done by clamping since the clamp connection is securely fixed against sliding by the lamination procedure. Alternatively, the supply line can also be printed onto the connection zone, for example, by means of a metal-containing and in particular silver-containing, electrically conductive printing paste.

In an advantageous embodiment of the invention, the composite pane according to the invention has a light irradiation means and a light deflection means. The light irradiation means and the light deflection means are arranged in or on the substrate and/or on the cover pane or between the intermediate layers or the carrier film.

According to the invention, the light irradiation means comprises at least one light source, preferably an LED or OLED. The particular advantage resides in the small dimensions and the low power consumption. The wavelength range emitted by the light source can be selected freely in the range of visible light, for example, based on practical and/or aesthetic considerations. The light irradiation means can include optical elements, in particular for guiding the light, preferably a reflector and/or a light waveguide, for example, a glass fiber or a polymeric optical fiber. The light irradiation means can be arranged at any location on the substrate or the cover pane, in particular on the lateral edge of the substrate or of the cover pane or in a small recess in the middle of the substrate or cover pane.

The light deflection means preferably includes particles, dot grids, stickers, deposits, notches, incisions, line grids, imprints, and/or screen prints and is suitable to decouple the light transported in the substrate or in the cover pane therefrom.

The light deflection means can be arranged at any position on the level of the substrate or the cover pane. It is particularly advantageous for the light deflection means to be arranged in the region of or in the immediate surroundings of the contact zone and thus to enable rapid finding of the otherwise hardly visible contact zone. This is particularly advantageous at night or in darkness.

Alternatively, light can be introduced to the contact zone through a waveguide that is arranged on the substrate, the intermediate layer, or the cover pane and can mark the contact zone.

Alternatively or in combination, the light irradiation means together with the light deflection means can visualize data on the pane, for example, report the switching state of the capacitive switching zone or indicate whether, for example, an electrical function is switched on or switched off.

In an alternative advantageous embodiment of the composite pane according to the invention, the contact zone is directly markable or marked by an active light source, preferably by a light emitting diode (LED), an organic light emitting diode (OLED), an incandescent light bulb, or other active luminary, such as a luminescent material, preferably a florescent or phosphorescent material.

In another alternative advantageous embodiment of the composite pane according to the invention, the contact zone is marked by a colored, preferably a white or black, imprint, for example, a screenprint, on the transparent substrate, the intermediate layer, or the cover pane. This has the particular advantage that the contact zone is marked durably and independently of a voltage source. The imprint can also contain a luminescent material, preferably a florescent or phosphorescent material and/or be luminescent.

Another aspect of the invention comprises a method for producing a composite pane with a capacitive switching zone, comprising at least:

(a) Application of an electrically conductive layer on a surface of a carrier film,
(b) Introduction of at least one separating line, which electrically divides the electrically conductive layer into at least one capacitive switching zone and at least forms a surrounding zone, preferably by laser patterning or by mechanical or chemical ablation, and
(c) Production of a stack sequence consisting of a substrate, a first intermediate layer, a second intermediate layer, and a cover pane, wherein the carrier film is arranged, at least in sections, between the first intermediate layer and the second intermediate layer,
(d) Lamination of the stack sequence to form a composite pane.

The application of the electrically conductive layer in process step (a) can be done by a method known per se, preferably by magnetically enhanced cathodic sputtering. This is particularly advantageous in terms of simple, quick, economical, and uniform coating of the substrate. However, the electrically conductive layer can also be applied, for example, by vapor deposition, chemical vapor deposition (CVD), plasma-enhanced chemical vapor deposition (PECVD), or by wet chemical processes.

The carrier film can be subjected to a temperature treatment after process step (a). The carrier film is heated along with the electrically conductive layer to a temperature of at least 200° C., preferably at least 300° C. The temperature treatment can also serve to increase transmittance and/or to reduce the sheet resistance of the electrically conductive layer.

The de-coating of individual separating lines in the electrically conductive layer is preferably done by a laser beam. Methods for patterning thin metal films are known, for example, from EP 2 200 097 A1 or EP 2 139 049 A1. The width of the de-coating is preferably 10 μm to 1000 μm, particularly preferably 30 μm to 200 μm, and in particular 70 μm to 140 μm. In this range, a particularly clean and residue-free de-coating by the laser beam takes place. De-coating by laser beam is particularly advantageous since the de-coated lines are optically very inconspicuous and impact the appearance and the transparency only a little. The de-coating of a line with a width that is wider than the width of a laser cut is done by repeated tracing of the line with the laser beam. Consequently, the process duration and the process costs increase with an increasing line width. Alternatively, the de-coating can be done by mechanical ablation as well as by chemical or physical etching.

The first or the second intermediate layer can be formed by a single film or even by two or more films that are arranged areally one over another.

The bonding of the substrate and cover pane in process step (d) is preferably done under the action of heat, vacuum, and/or pressure. Methods known per se for producing a composite pane can be used.

For example, so-called autoclave methods can be performed at an elevated pressure of roughly 10 bar to 15 bar and temperatures from 130° C. to 145° C. over roughly 2 hours. Vacuum bag or vacuum ring methods known per se operate, for example, at roughly 200 mbar and 80° C. to 110° C. The first pane, the thermoplastic intermediate layer, and the second pane can also be pressed in a calender between at least one pair of rollers to form a pane. Systems of this type are known for producing panes and normally have at least one heating tunnel upstream before a pressing facility. The temperature during the pressing procedure is, for example, from 40° C. to 150° C. Combinations of calender and autoclave processes have particularly proved their worth in practice. Alternatively, vacuum laminators can be used. These consist of one or a plurality of heatable and evacuable chambers, in which the first pane and the second pane are laminated within, for example, roughly 60 minutes at reduced pressures of 0.01 mbar to 800 mbar and temperatures from 80° C. to 170° C.

Another aspect of the invention comprises the use of the electrically heatable pane with a capacitive switching zone according to the invention in buildings, in particular in the access area, window area, roof area, or façade area, as a built-in component in furniture and devices, in means of transportation for travel on land, in the air, or on water, in particular in trains, ships, and motor vehicles, for example, as a windshield, rear window, side window, and/or roof panel.

The invention further comprises the use of the capacitive switching zone for the electrical control of a function inside or outside the composite pane, preferably a heating function, lighting, in particular a lighting means arranged in the composite pane such as an LED, a change in the optical transparency of a functional intermediate layer, in particular a suspended particle device (SPD) layer or an electrochromic intermediate layer.

In the following, the invention is explained in detail with reference to drawings and exemplary embodiments. The drawings are a schematic representation and not true to scale. The drawings in no way restrict the invention.

Figure 1B:
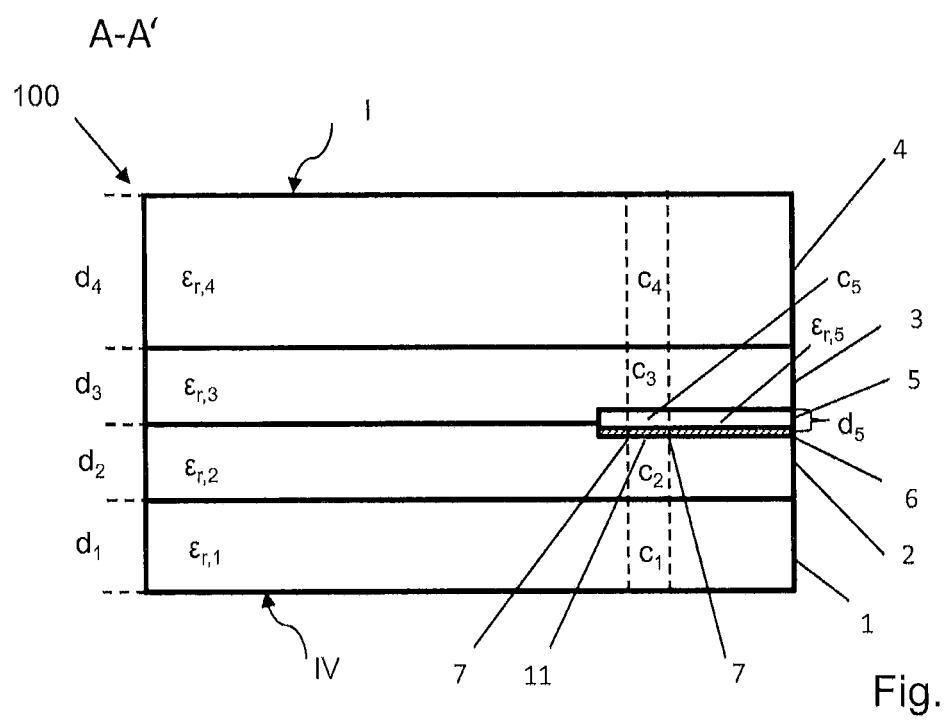
Figure 1C:
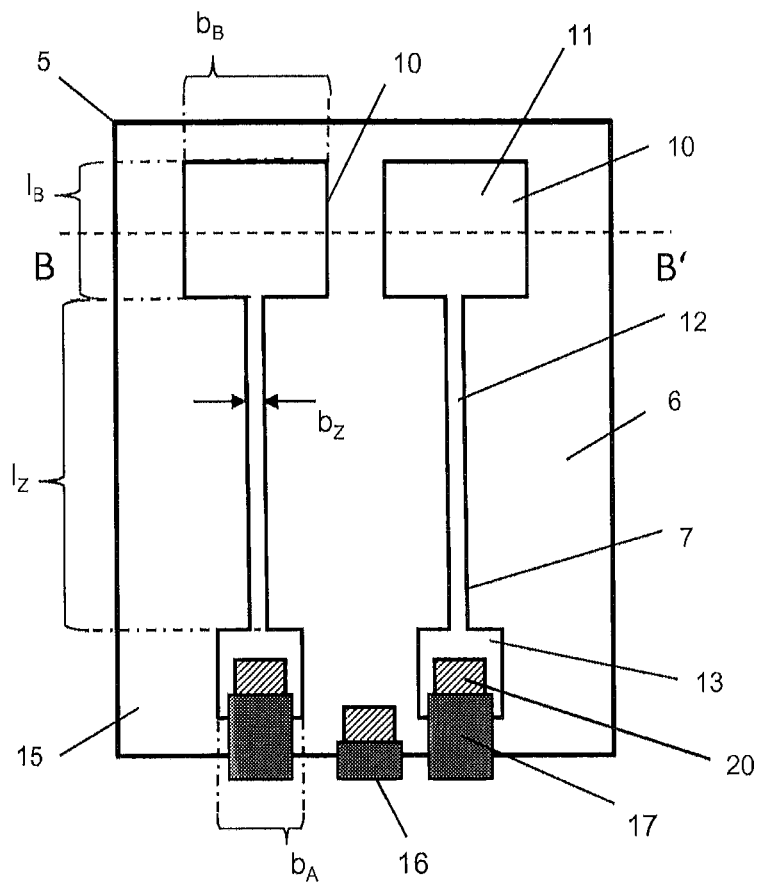
Figure 1D:
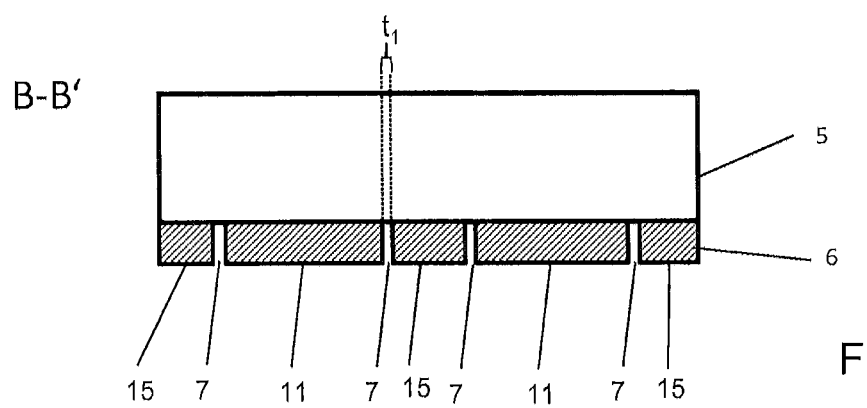
Figure 2A:
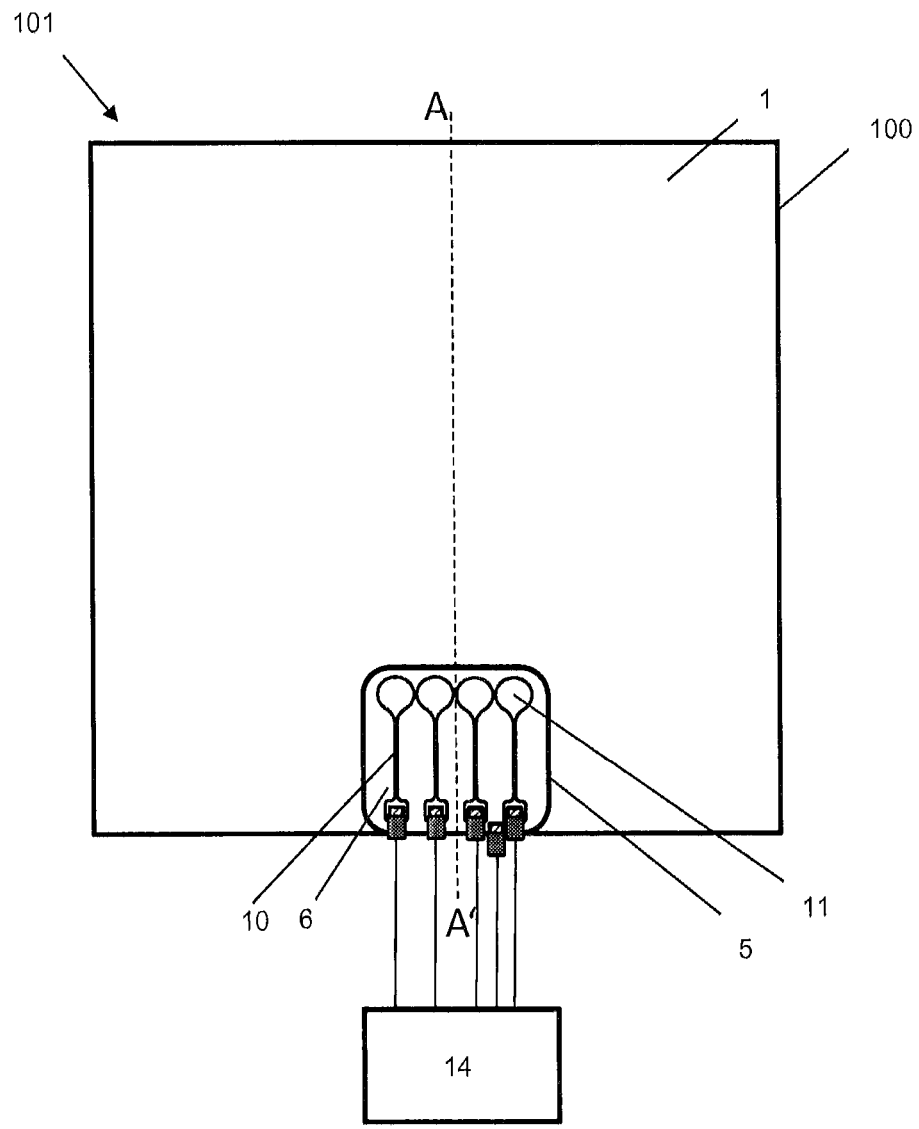
Figure 2B:
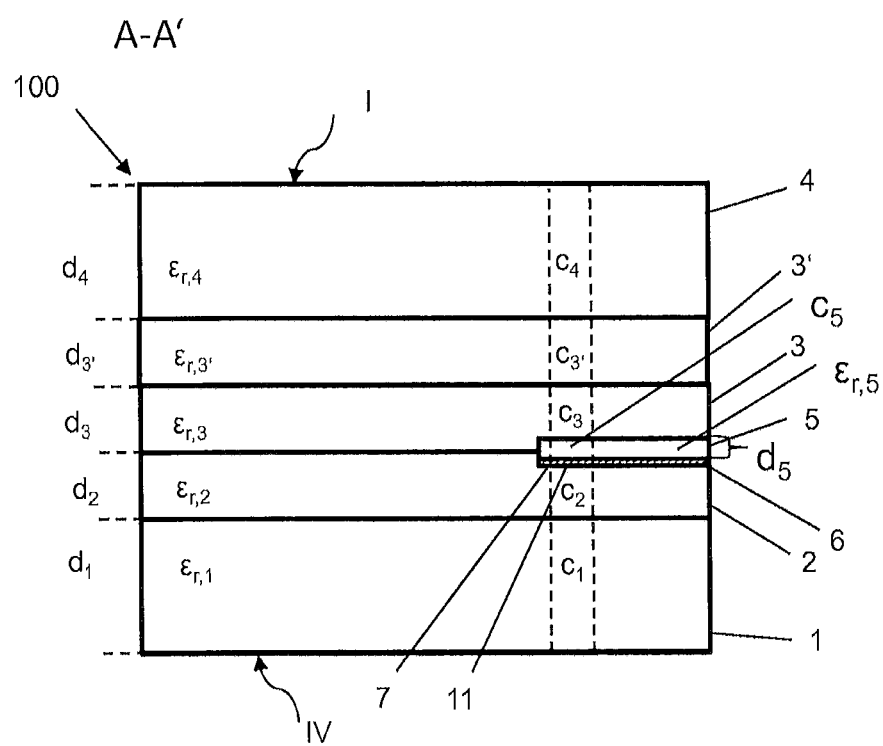
Figure 2C:
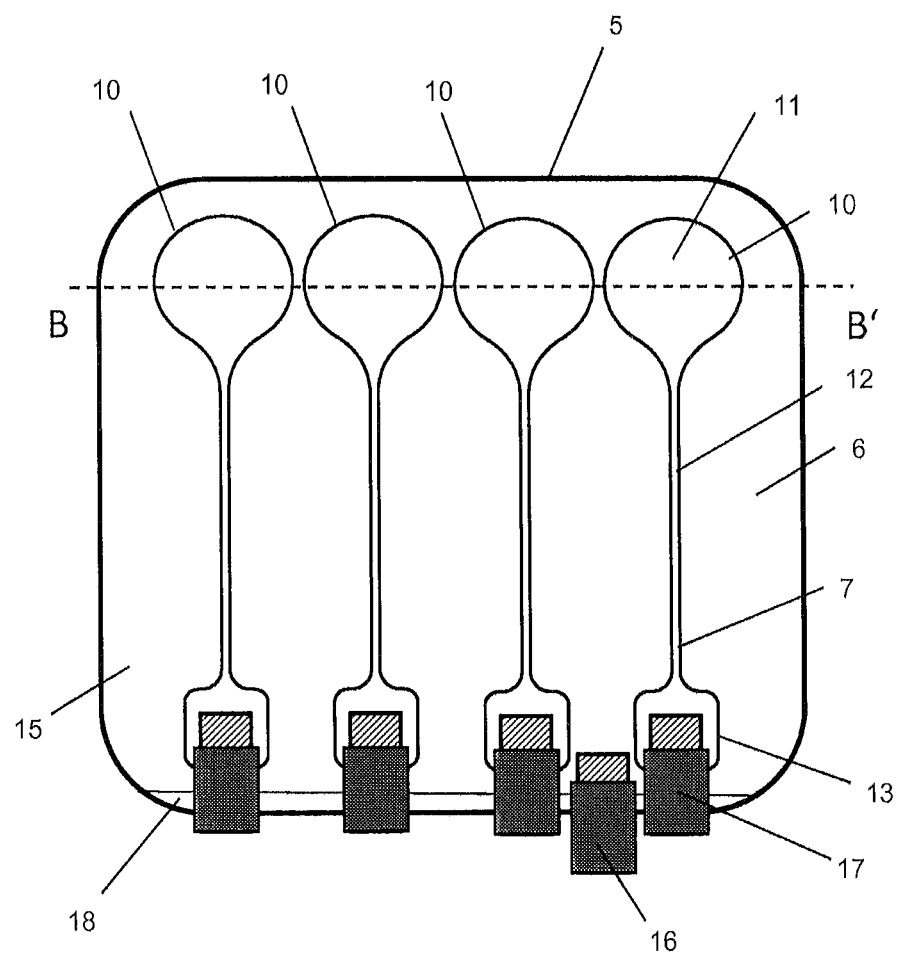
Figure 2D:
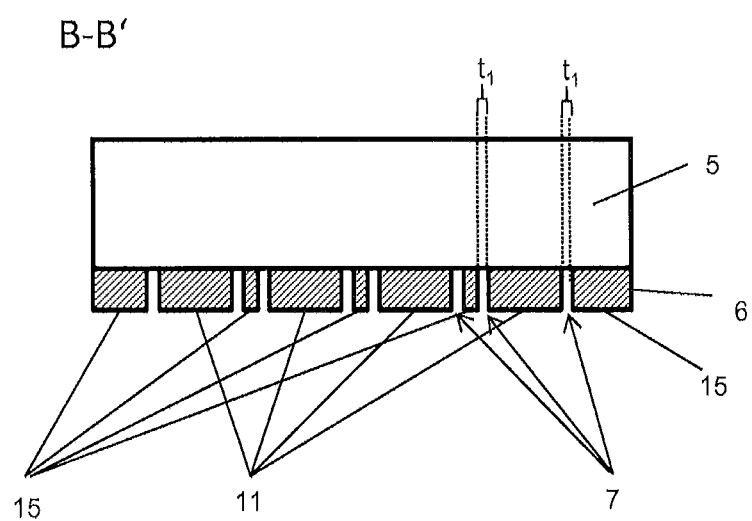
Figure 3:
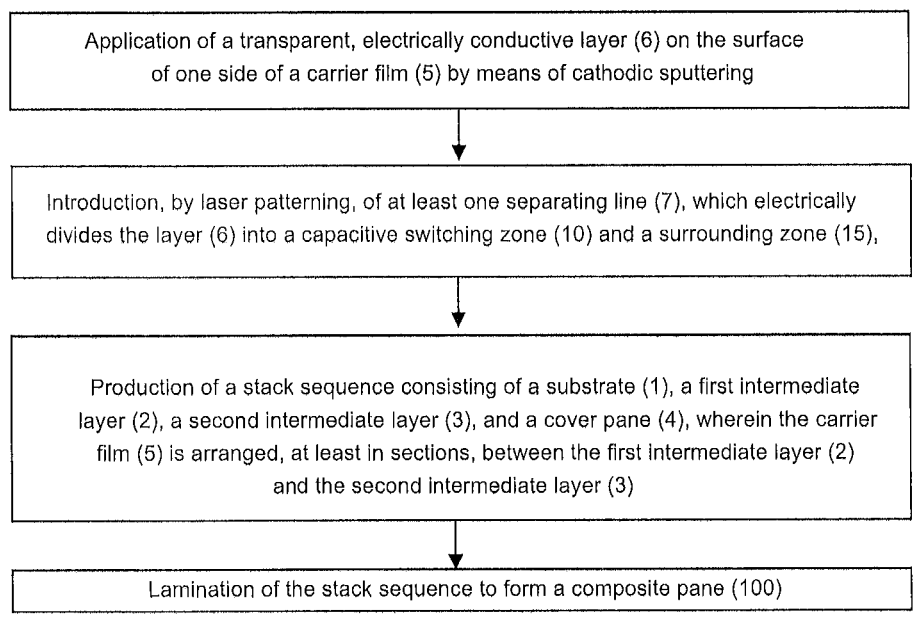

They depict:

FIG. 1A a plan view of an embodiment of a pane arrangement according to the invention with a composite pane according to the invention, FIG. 1B a cross-sectional representation along the section line A-A' of FIG. 1A, FIG. 1C an enlarged representation of the carrier film according to the invention of FIG. 1A, FIG. 1D a cross-sectional representation along the section line B-B' of FIG. 1C, FIG. 2A a plan view of an alternative embodiment of the pane arrangement according to the invention with a composite pane according to the invention, FIG. 2B a cross-sectional representation along the section line A-A' of FIG. 2A, FIG. 2C an enlarged representation of the carrier film according to the invention of FIG. 2A, FIG. 2D a cross-sectional representation along the section line B-B' of FIG. 2C, and FIG. 3 a detailed flow chart of one embodiment of the method according to the invention.

FIG. 1A depicts a plan view of an exemplary embodiment of a pane arrangement 101 according to the invention with a composite pane 100 according to the invention.

FIG. 1B is a cross-sectional representation along the section line A-A' of FIG. 1A. The composite pane 100 comprises here, for example, one substrate 1 and one cover pane 4 that are bonded to each other via a first intermediate layer 2 and a second intermediate layer 3. The composite pane 100 is, for example, a motor vehicle pane and, in particular, the windshield of a passenger car. The dimensions of the composite pane 100 are, for example, 0.9 m×1.5 m. The substrate 1 is, for example, intended to be turned toward the interior in the installed position. In other words, the outside surface IV of the substrate 1 is accessible from the interior; whereas, in contrast, the outside surface I of the cover pane 4 points outward relative to the vehicle interior. The substrate 1 and cover pane 4 are made, for example, of soda lime glass. The thickness $d_1$ of the substrate 1 is, for example, 1.6 mm and the thickness $d_4$ of the cover pane 4 is 2.1 mm. Of course, the substrate 1 and cover pane 4 can have any thicknesses, and, for example, can also be implemented with the same thickness. The intermediate layers 2,3 are thermoplastic intermediate layers and are made of polyvinyl butyral (PVB). They have, in each case, a thickness $d_{2/3}$ of 0.38 mm. A carrier film 5 with a capacitive switching zone 10 is arranged between the first intermediate layer 2 and the second intermediate layer 3 in the central, lower section of the composite pane 100.

FIG. 1C depicts an enlarged representation of the carrier film 5 according to the invention of FIG. 1A. FIG. 1D depicts a corresponding cross-sectional representation along the section line B-B' of FIG. 1C.

The carrier film 5 is, in this example, a transparent polyethylene terephthalate (PET) film with a thickness $d_5$ of 0.05 mm. A transparent, electrically conductive layer 6 is arranged on the carrier film 5. The electrically conductive layer 6 is a layer system that includes, for example, three electrically conductive silver layers that are separated from one another by dielectric layers.

The electrically conductive layer 6 extends, for example, over one entire side of the carrier film 5. In the exemplary embodiment depicted, the electrically conductive layer 6 is arranged on that side of the carrier film 5 that faces the substrate 1. The carrier film 5 is set back by a distance of roughly 8 mm from the pane edge into the pane interior. This region is hermetically sealed by gluing the two intermediate layers 2,3 during lamination such that the electrically conductive layer 6 is protected against moisture from the surroundings of the composite pane 100 and, thus, against corrosion and damage. Alternatively, it would be possible to leave the carrier film 5 coating free in an edge region or to remove the electrically conductive layer 6 there.

The electrically conductive layer 6 is divided by coating-free separating lines 7 into different zones electrically isolated from each other. In the example depicted in FIG. 1C, two capacitive switching zones 10 are electrically divided by a common surrounding zone 15. Each switching zone 10 includes a contact zone 11, which is implemented approx. square and transitions into a strip-shaped supply line zone 12. The width $b_B$ and the length $l_B$ of the contact zone 11 is, in each case, for example, 40 mm. The width $b_Z$ of the supply line zone 12 is, for example, 1 mm. The ratio of $b_Z{:}b_B$ is thus roughly 1:40. The supply line zone 12 is connected to a connection zone 13. The connection zone 13 has a square shape and an edge length $b_A$ of, for example, 12 mm. The length $l_Z$ of the supply line zone is roughly 48 mm.

The separating line 7 has only a width $t_1$ of, for example, 100 μm and is introduced into the electrically conductive layer 6, for example, by laser patterning. Separating lines 7 with such a low width are hardly perceptible optically and interfere only a little with vision through the composite pane 100, which, particularly for use in motor vehicles, is of special importance for driving safety and is also particularly aesthetic.

The connection zone 13 is electrically conductively connected to a foil conductor 17 via an electrical line connection 20. A reliable electrically conductive connection is preferably obtained by means of an electrically conductive adhesive. The foil conductor 17 is made, for example, from a 50-μm-thick copper foil and is, for example, insulated outside the connection zone 13 with a polyimide layer. Thus, the foil conductor 17 can be guided out, without an electrical short, beyond the surrounding zone 15 over the bottom edge of the composite pane 100. Of course, the electrical line connection of the connection zone to the outside can also be guided outward via insulated wires or via a zone in which the electrically conductive layer of the surrounding zone is interrupted.

Here, the foil conductor 17 is, for example, connected to capacitive sensor electronics 14 outside the composite pane 100. Moreover, the surrounding zone 15 is also connected to the sensor electronics 14 via another connection zone 16. The sensor electronics 14 are suited to precisely measure capacitance changes of the switching zone 10 relative to the surrounding zone 15 and to forward a switching signal, for example, to the CAN-Bus of a motor vehicle as a function of a threshold value. Any functions in the motor vehicle can be switched via the switching signal. For example, lighting in or on the composite pane 100 can be switched on or off.

When the composite pane 100 is used, for example, as a windshield in a motor vehicle, the length of the supply line zone 12 can be selected such that the driver of the vehicle or the front seat passenger can comfortably reach the contact zone 11 of the switching zone 10.

In the exemplary embodiment depicted, the structure and tuning of the sensor electronics 14 are coordinated such that when the outside pane surface IV of the substrate 1 is touched above the contact zone 11 of the capacitive switching zone 10, a switching signal is triggered, whereas when the outside pane surface I of the cover pane 4 is touched over the capacitive switching zone 10, no switching signal is triggered. To this end, the thicknesses and the materials of the composite pane according to the invention 100 are selected according to the invention such that the surface capacitance $c_I$ between the contact zone 11 and the outside surface IV of the substrate 1 is greater than the surface capacitance $c_A$ between the contact zone 11 and the outside surface I of the cover pane 4.

The surface capacitance $c_I$ or $c_A$ is, in the context of the present invention, defined as the capacitance of a plate capacitor of that zone of the composite pane 100 that results from orthogonal projection of the contact zone 11 between the contact zone 11 and the outside surface IV of the substrate 1 or the outside surface I of the cover pane 4, with the resultant capacitance normalized to the area of the contact zone.

In the example depicted in detail in FIG. 1B, the surface capacitance $c_I$ between the contact zone 11 and the outside surface IV of the substrate 2 results as the serial connection of the individual capacitances $(1/c_1+1/c_2)^{-1}$, with the individual capacitance resulting at $c_i = \varepsilon_0 * \varepsilon_{r,i}/d_i$. This corresponds to the capacitance $C_i$ of the respective individual layer with relative permittivity $\varepsilon_{r,i}$ and thickness $d_i$, normalized to the area A of the contact zone 11, i.e., $c_i = C_i/A$.

Moreover, the surface capacitance $c_1$ between the contact zone 11 and the outside surface I of the cover pane 4 results as the serial connection of the individual capacitances $(1/c_3+1/c_4+1/c_5)^{-1}$.

The relative permittivity of the substrate 1 and of the cover pane 4 are, here, for example, $\varepsilon_{r,1}=\varepsilon_{r,4}=7$; the relative permittivity of the first intermediate layer 2 and the second intermediate layer 3 are, here, for example, $\varepsilon_{r,2}=\varepsilon_{r,3}=2.6$; and the relative permittivity of the carrier film 5 is, here, for example, $\varepsilon_{r,5}=3$.

This yields a ratio of the surface capacitances $c_I{:}c_A$ at 1.2:1.

Moreover, in this example, the area A of the contact zone 11 and in particular its width $b_B$ is coordinated with the width $b_Z$ of the supply line zone 12 such that a switching signal is issued only when the outside surface IV of the substrate is touched above the contact zone 11 (i.e., in the region of the surface IV that results from orthogonal projection of the contact zone 11 onto the surface IV) and not when the surface IV above the supply line zone 12 is touched.

FIG. 2A depicts a plan view of an alternative exemplary embodiment of a pane arrangement 101 according to the invention with the composite pane 100 according to the invention.

FIG. 2B is a cross-sectional representation along the section line A-A' of FIG. 2A. The composite pane 100 comprises here, for example, one substrate 1 and one cover pane 4, which are bonded to each other via a first intermediate layer 2 and a second intermediate layer 3. The composite pane 100 is, for example, a motor vehicle pane and, in particular, the roof panel of a passenger car. The dimensions of the composite pane 100 are, for example, 1.2 m×1.2 m. The substrate 1 is, for example, intended to be turned toward the interior in the installed position. In other words, the outside surface IV of the substrate 1 is accessible from the interior; whereas, in contrast, the outside surface I of the cover pane 4 points outward. The substrate 1 and cover pane 4 are made, for example, of soda lime glass. The thickness $d_1$ of the substrate 1 is, for example, 2.1 mm; and the thickness $d_4$ of the cover pane 4 is, for example, also 2.1 mm. In this exemplary embodiment, the second intermediate layer 3,3' is implemented in two layers. The intermediate layers 2,3,3' are thermoplastic intermediate layers and are made of polyvinyl butyral (PVB). They have, in each case, a thickness $d_{2/3/3'}$ of 0.38 mm. A carrier film 5 with a capacitive switching zone 10 is arranged between the first intermediate layer 2 and the second intermediate layer 3 in the central, lower section of the composite pane 100.

FIG. 2C depicts an enlarged representation of the carrier film 5 according to the invention of FIG. 2A. FIG. 2D depicts a corresponding cross-sectional representation along the section line B-B' of FIG. 2C.

The carrier film 5 is, in this example, a transparent polyethylene terephthalate (PET) film with a thickness $d_5$ of 0.05 mm. Here, the carrier film 5 has a length of, for example, 250 mm and a width of, for example, 120 mm. A transparent, electrically conductive layer 6 is arranged on the carrier film 5. The electrically conductive layer 6 is a layer system that includes, for example, three electrically conductive silver layers that are separated from one another by dielectric layers.

The electrically conductive layer 6 extends, for example, over the entire surface of one side of the carrier film 5, minus a 10-mm-wide coating-free edge strip 18 that is turned toward the outer pane edge of the composite pane 100. This region is hermetically sealed by gluing the two intermediate layers 2,3 during lamination such that the electrically conductive layer 6 is protected against moisture from the surroundings of the composite pane 100 and, thus, against corrosion and damage. In the exemplary embodiment depicted, the electrically conductive layer 6 is arranged on the side of the carrier film 5 that is turned toward the substrate 1.

The electrically conductive layer 6 is divided by coating-free separating lines 7 into different zones electrically isolated from each other. In the example depicted in FIG. 2C, four capacitive switching zones 10 are electrically divided by a common surrounding zone 15. Each switching zone 10 includes a contact zone 11, which is implemented approx. drop-shaped and transitions into a strip-shaped supply line zone 12. The width $b_B$ and the length $l_B$ of the contact zone 11 is, in each case, for example, 40 mm. The width $b_Z$ of the supply line zone 12 is, for example, 1 mm. The ratio of $b_Z:b_B$ is thus roughly 1:40. The supply line zone 12 is connected to a connection zone 13. The connection zone 13 has a square shape with rounded corners and an edge length $b_A$ of, for example, 12 mm. The length $l_Z$ of the supply line zone is roughly 48 mm.

The separating line 7 has only a width $t_1$ of, for example, 100 µm and is introduced into the electrically conductive layer 6, for example, by laser patterning. Separating lines 7 with such a low width are hardly perceptible optically and interfere only a little with vision through the composite pane 100, which, particularly for use in motor vehicles as a roof panel, is particularly aesthetic.

The connection zone 13 is electrically conductively connected to a foil conductor 17 via an electrical line connection 20. A reliable electrically conductive connection is preferably obtained by means of an electrically conductive adhesive. The foil conductor 17 is made, for example, from a 50-µm-thick copper foil and is, for example, insulated outside the connection zone 13 with a polyimide layer. Thus, the foil conductor 17 can be guided out, without an electrical short, beyond the surrounding zone 15 over the bottom edge of the composite pane 100. Of course, the electrical connection of the connection zone 13 to the outside can also be guided outward via insulated wires or via a zone in which the surrounding zone 15 is interrupted.

Here, the foil conductor 17 is, for example, connected to capacitive sensor electronics 14 outside the composite pane 100. Moreover, the surrounding zone 15 is also connected to the sensor electronics 14 via another connection zone 16. The sensor electronics 14 are suited to precisely measure capacitance changes of the switching zone 10 relative to the surrounding zone and to forward a switching signal, for example, to the CAN-Bus of a motor vehicle as a function of a threshold value. Any functions in the motor vehicle can be switched via the switching signal. For example, the composite pane 100 can have a suspended particle device (SPD) layer, an electrochromic or other type of layer or film for controlling the optical transparency, which can be altered in its optical transparency by means of the switching signal, here, for example, with four transparency levels, which can, in each case, be selected via the four capacitive switching zones. Of course, alternatively or additionally, other electrical functions such as electrical heating or electrical lighting can also be controlled.

When the composite pane 100 is used, for example, as a roof panel in a motor vehicle, the length of the supply line zone 12 can be selected such that the driver of the vehicle, the front seat passenger, or passengers in the back seat can comfortably reach the contact zone 11 of the switching zone 10. Of course, for this, multiple carrier films 5 can also be arranged in the composite pane 100, for example, in each case, a carrier film 5 for each vehicle occupant.

In the exemplary embodiment depicted, the structure and tuning of the sensor electronics 14 are coordinated such that when the outside pane surface IV of the substrate 1 is touched above the contact zone 11 of the capacitive switching zone 10, a switching signal is triggered, whereas when the outside pane surface I of the cover pane 4 is touched, no switching signal is triggered. This has the particular advantage that no switching signal can be triggered as a result of intentional or inadvertent touching of the composite pane 100 from outside the motor vehicle. In addition, the inadvertent triggering of a switching signal, for example, by rain or a carwash, is avoided. To this end, the thicknesses and the materials of the composite pane 100 according to the invention are selected according to the invention such that the surface capacitance $c_I$ between the contact zone 11 and the outside surface IV of the substrate 1 is greater than the surface capacitance $c_A$ between the contact zone 11 and the outside surface I of the cover pane 4.

In the example depicted in detail in FIG. 2B, the surface capacitance $c_I$ between the contact zone 11 and the outside surface IV of the substrate 2 results as the serial connection of the individual capacitances $(1/c_1+1/c_2)^{-1}$. Moreover, the surface capacitance $c_I$ between the contact zone 11 and the outside surface I of the cover pane 4 results as the serial connection of the individual capacitances $(1/c_3+1/c_{3'}1/c_4+1/c_5)^{-1}$. The relative permittivity of the substrate 1 and of the cover pane 4 here are, for example, $\varepsilon_{r,1}=\varepsilon_{r,4}=7$; the relative permittivity of the first intermediate layer 2 and the second intermediate layer 3,3' here are, for example, $\varepsilon_{r,2}=\varepsilon_{r,3}=\varepsilon_{r,3'}=2,6$; and the relative permittivity of the carrier film 5 here is, for example, $\varepsilon_{r,5}=3$. This yields a ratio of the surface capacitances $c_I:c_A$ at 1.4:1.

Moreover, in this example, the area A of the contact zone 11 and in particular its width $b_B$ is coordinated with the width $b_Z$ of the supply line zone 12 such that a switching signal is issued only when the outside surface IV of the substrate is touched above the contact zone 11 (i.e., in the region of the outside surface IV that results from orthogonal projection of the contact zone 11 onto the outside surface IV) and not when the outside surface IV is touched above the supply line zone 12.

FIG. 3 depicts a flowchart of an exemplary embodiment of the method according to the invention for producing a composite pane 100 with a capacitive switching zone 10.

Table 1 depicts the calculation of the ratios of the surface capacitances $c_I:c_A$ of five exemplary embodiments Example 1-5 for various material thicknesses and material parameters. The calculation of the surface capacitances was presented in detail above under FIG. 1 and FIG. 2. Example 3 corresponds to the exemplary embodiment of FIG. 1 and Example 1 corresponds to the exemplary embodiment of FIG. 2.

electronics 14. Moreover, due to the low width of the separating lines 7, vision through the pane is only minimally affected and meets, for example, the requirements for motor vehicle glazing.

Particularly advantageously and surprisingly, a pane arrangement 101 with a composite pane 100, wherein the sensitivity of the sensor electronics 14 with the ratio of the surface capacitances $c_I:c_A$ above the contact zones 11 is tuned such that selective triggering of the switching operation is possible only from an outside surface IV of the composite pane 100.

This result was unexpected and surprising for the person skilled in the art.

LIST OF REFERENCE CHARACTERS

1 substrate
2 first intermediate layer
3,3' second intermediate layer
4 cover pane
5 carrier film
6 electrically conductive layer
7 separating line
10 capacitive switching zone
11 contact zone
12 supply line zone
13 connection zone
14 capacitive sensor electronics
15 surrounding zone
16 additional connection zone
17 foil conductor
18 coating-free edge strip
20 electrical line connection
100 composite pane
101 pane arrangement
A area of the contact zone 11

TABLE 1

|  | Example 1 Thickness [mm] | Example 2 Thickness [mm] | Example 3 Thickness [mm] | Example 4 Thickness [mm] | Example 5 Thickness [mm] |
|---|---|---|---|---|---|
| Cover pane (4) Glass, $\varepsilon_r = 7$ | 2.1 | 2.1 | 2.1 | 2.1 | 1.8 |
| Second intermediate layer (3) PVB, $\varepsilon_r = 2.6$ | 0.76 | 0.76 | 0.38 | 0.38 | 0.38 |
| Carrier film (5) PET, $\varepsilon_r = 3$ | 0.05 | 0.05 | 0.05 | 0.05 | 0.05 |
| First intermediate layer (2) PVB, $\varepsilon_r = 2.6$ | 0.38 | 0.38 | 0.38 | 0.38 | 0.38 |
| Substrate (1) Glass, $\varepsilon_r = 7$ | 2.1 | 1.6 | 1.6 | 1.8 | 1.4 |
| $c_A$ in F/m$^2$ | 1.45E-08 | 1.45E-08 | 1.91E-08 | 1.91E-08 | 2.11E-08 |
| $c_I$ in F/m$^2$ | 1.98E-08 | 2.36E-08 | 2.36E-08 | 2.20E-08 | 2.56E-08 |
| $c_I:c_A$ | 1.4 | 1.6 | 1.2 | 1.1 | 1.2 |

Composite panes 100 according to the invention have ratios of surface capacitances $c_I:c_A$ greater than or equal to 1.1:1. With such ratios, it was possible to obtain a particularly good differentiation between touching the contact surface 11 above the outside surface IV of the substrate 1 in contrast with the outside surface I of the cover pane 4.

The composite pane 100 according to the invention according to FIGS. 1 and 2 has a capacitive switching zone 10, which is, for example, connectable to capacitive sensor $b_A$ width of the connection zone 13
$b_B$ width of the contact zone 11
$b_Z$ width of the supply line zone 12
$C_I, C_A, C_{1 \ldots 5}$ surface capacitance
$C_{1 \ldots 5}$ capacitance
$d_1, d_2, d_3, d_{3'}, d_4, d_5$ thickness
$\varepsilon_0$ electric field constant
$\varepsilon_{r,1}, \varepsilon_{r,2}, \varepsilon_{r,3}, \varepsilon_{r,3'}, \varepsilon_{r,4}, \varepsilon_{r,5}$ relative permittivity
$l_A$ length of the connection zone 13

$l_B$ length of the contact zone 11
$l_Z$ length of the supply line zone 12
$t_1$ width of the separating line 7
A-A' section line
B-B' section line
I outside surface of the cover pane 4
IV outside surface of the substrate 1

The invention claimed is:

1. A composite pane with a capacitive switching zone, comprising:
   a substrate,
   at least one first intermediate layer, which is areally bonded to the substrate,
   at least one second intermediate layer, which is areally bonded to the first intermediate layer, and
   a cover pane, which is areally bonded to the second intermediate layer,
   wherein
   a carrier film with an electrically conductive layer is arranged, at least in sections, between the first intermediate layer and the second intermediate layer,
   at least one capacitive switching zone is electrically isolated from the electrically conductive layer by at least one coating-free separating line,
   the capacitive switching zone has a contact zone, a supply line zone, and a connection zone; the supply line zone electrically connects the contact zone to the connection zone, and the connection zone is electrically connectable to sensor electronics, and
   a surface capacitance $c_I$ between the contact zone and an outside surface of the substrate is greater than a surface capacitance $c_A$ between the contact zone and an outside surface of the cover pane.

2. The composite pane according to claim 1, wherein a ratio of the surface capacitance $c_I$ to the surface capacitance $c_A$ is greater than or equal to 1.1:1.

3. The composite pane according to claim 1, wherein the supply line zone has a length $l_Z$ of 1 cm to 70 cm and has a width $b_Z$ of 0.5 mm to 10 mm.

4. The composite pane according to claim 1 through, wherein a ratio of length $l_Z$ to width $b_Z$ of the supply line zone is less than or equal to 1:700.

5. The composite pane according to claim 1, wherein an area of the contact zone is from 1 cm$^2$ to 200 cm$^2$ and/or has the shape of a rectangle, square, trapezoid, triangle, circle, ellipse, or drop or has rounded corners.

6. The composite pane according to claim 1 through, wherein a region of the electrically conductive layer outside the capacitive switching zone forms a surrounding zone, which is connectable to the sensor electronics via another connection zone.

7. The composite pane according to claim 1, wherein a width $t_1$ of the separating line is from 30 µm to 200 µm preferably.

8. The composite pane according to claim 1, wherein the first intermediate layer and/or the second intermediate layer is transparent, contains or is made of polyvinyl butyral (PVB), and/or has a relative permittivity $\varepsilon_{r,2/3/3'}$ of 2 to 4.

9. The composite pane according to claim 1 through, wherein the carrier film is transparent, contains or is made of polyethylene terephthalate, and/or has a relative permittivity $\varepsilon_{r,5}$ of 2 to 4.

10. The composite pane according to claim 1, wherein the substrate and/or the cover pane contains glass or polymers, and/or has a relative permittivity $\varepsilon_{r,1/4}$ of 2 to 8.

11. The composite pane according to claim 1, wherein the electrically conductive layer is transparent and/or has a sheet resistance of 0.4 ohm/square to 200 ohm/square and/or contains silver (Ag), indium tin oxide (ITO), fluorine-doped tin oxide (SnO$_2$:F), or aluminum-doped zinc oxide (ZnO:Al).

12. A pane arrangement comprising:
   a composite pane according to claim 1, and
   capacitive sensor electronics, which are electrically connected to the connection zone,
   wherein the sensitivity of the sensor electronics is selected such that a switching signal is issued when the contact zone on the surface of the substrate is touched by a human finger and no switching signal or a different switching signal is issued when the contact zone on the surface of the cover pane is touched.

13. A pane arrangement comprising:
   a composite pane according to claim 1, and
   capacitive sensor electronics, which are electrically connected to the connection zone,
   wherein the sensitivity of the sensor electronics is selected such that a switching signal is issued when the contact zone on the surface of the substrate and/or the surface of the cover pane is touched by a human finger and no switching signal or a different switching signal is issued when the supply line zone on the surface of the substrate and/or the surface of the cover pane is touched.

14. A method for producing a composite pane according to claim 1, comprising:
   applying an electrically conductive layer on a surface of a carrier film,
   introducing at least one separating line, which electrically divides the layer into at least one capacitive switching zone and at least one surrounding zone, and
   producing a stack sequence consisting of a substrate, a first intermediate layer, a second intermediate layer, and a cover pane, wherein the carrier film is arranged, at least in sections, between the first intermediate layer and the second intermediate layer, and
   laminating the stack sequence to form a composite pane.

15. The composite pane according to claim 2, wherein the ratio of the surface capacitance $c_I$ to the surface capacitance $c_A$ is greater than or equal to 1.2:1.

16. The composite pane according to claim 3, wherein the supply line zone has a length $l_Z$ of 1 cm to 8 cm and has a width $b_Z$ of 0.5 mm to 2 mm.

17. The composite pane according to claim 3, wherein the supply line zone has a shape of a rectangle, a strip, or a line.

18. The composite pane according to claim 4, wherein the ratio of length $l_Z$ to width $b_Z$ of the supply line zone is from 1:5 to 1:100.

19. The composite pane according to claim 5, wherein the area of the contact zone is from 1 cm$^2$ to 9 cm$^2$.

20. The composite pane according to claim 7, wherein the width $t_1$ of the separating line is from 70 µm to 140 µm.

21. The composite pane according to claim 8, wherein the relative permittivity $\varepsilon_{r,2/3/3'}$ is from 2.1 to 2.9.

22. The composite pane according to claim 9, wherein the relative permittivity $\varepsilon_{r,5}$ is from 2.7 to 3.3.

23. The composite pane according to claim 10, wherein the glass is selected from the group consisting of flat glass, float glass, quartz glass, borosilicate glass, soda lime glass, and the polymers are selected from the group consisting of polyethylene, polypropylene, polycarbonate, polymethyl methacrylate, and/or mixtures thereof.

24. The composite pane according to claim 10, wherein the relative permittivity $\varepsilon_{r,1/4}$ is from 6 to 8.

25. The composite pane according to claim 11, wherein the sheet resistance is from 0.5 ohm/square to 20 ohm/square.

26. The method for producing a composite pane according to claim 14, wherein the at least one separating line is introduced by laser patterning or by mechanical or chemical ablation.

* * * * *